(12) United States Patent
Lin (10) Patent No.: US 11,145,718 B2
(45) Date of Patent: Oct. 12, 2021

(54) SEMICONDUCTOR DEVICE WITH SEPARATE ACTIVE REGION AND METHOD OF FABRICATING THE SAME

(71) Applicant: MACRONIX International Co., Ltd., Hsinchu (TW)

(72) Inventor: Wei-Chih Lin, Chiayi (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/674,973

(22) Filed: Nov. 5, 2019

(65) Prior Publication Data
US 2021/0134954 A1 May 6, 2021

(51) Int. Cl.
| | | |
|---|---|---|
| H01L 29/06 | (2006.01) | |
| H01L 29/423 | (2006.01) | |
| H01L 29/66 | (2006.01) | |
| H01L 29/78 | (2006.01) | |

(52) U.S. Cl.
CPC ...... *H01L 29/0696* (2013.01); *H01L 29/0653* (2013.01); *H01L 29/4238* (2013.01); *H01L 29/66681* (2013.01); *H01L 29/7816* (2013.01)

(58) Field of Classification Search
None
See application file for complete search history.

(56) References Cited

U.S. PATENT DOCUMENTS 9,899,487 B2 * 2/2018 Lee .................... H01L 29/7827
9,947,678 B2 * 4/2018 Hsieh ................ H01L 27/11526

\* cited by examiner

*Primary Examiner* — Long Pham
(74) *Attorney, Agent, or Firm* — J.C. Patents (57) ABSTRACT

The disclosure provides a semiconductor device having a separate active region and a method of fabricating the same. The semiconductor device includes a substrate, a plurality of isolation islands, a source region, and a drain region. The substrate includes a first active region, a second active region, and a plurality of separate active regions. The separate active regions are connected to the first active region and the second active region. The separate active regions and the isolation islands are alternately disposed. The gate structure includes a body portion and a plurality of extensions. The body portion disposed on a portion of the first active region. The extensions are coupled to the body portion and extend from the body portion to the isolation islands. The source region and the drain region are respectively located in the substrate in the first active region and the second active region.

9 Claims, 13 Drawing Sheets

SEMICONDUCTOR DEVICE WITH SEPARATE ACTIVE REGION AND METHOD OF FABRICATING THE SAME

BACKGROUND

Technical Field

The disclosure relates to a semiconductor device and a method of fabricating the same.

Description of Related Art

High-voltage (HV) transistors (e.g., metal-oxide-semiconductor field-effect transistor, MOSFET) may serve as high-voltage switches in high-voltage switching regulators and power management integrated circuits (ICs). To handle the high voltages involved in these and other high-voltage applications, the HV transistors are desirable to have high breakdown voltages and low on-resistances.

SUMMARY

The embodiments of the disclosure provide a semiconductor device having a separate active region and a fabricating method thereof. The semiconductor device is capable of achieving a high breakdown voltage and a low on-resistance.

An embodiment of the disclosure provides a semiconductor device including a substrate, a plurality of isolation islands, a gate structure, a source region, and a drain region. The substrate includes a first active region, a second active region, and a plurality of separate active regions. The separate active regions extend along a first direction, and are arranged along a second direction, located between the first active region and the second active region, and respectively connected with the first active region and the second active region. The isolation islands are located in the substrate. The isolation islands and the separate active regions are alternately disposed along the second direction. The gate structure is disposed on a substrate. The gate structure includes a body portion and a plurality of extensions. The body portion extends along the second direction and is disposed on a portion of the first active region. The extensions are connected with the body portion and extend from the body portion to the isolation islands along the first direction. The extensions and the separate active regions are alternately disposed along the second direction. The source region is located in the substrate in the first active region. The drain region is located in the substrate in the second active region.

An embodiment of the disclosure provides a fabricating method of a semiconductor device including the following. An isolation structure is formed in a substrate. The isolation structure includes a plurality of isolation islands. The isolation structure defines a first active region, a second active region, and a plurality of separate active regions between the first active region and the second active region. The separate active regions extend along a first direction and are respectively connected with the first active region and the second active region. The separate active regions and the isolation islands are alternately disposed along a second direction. A gate structure is formed on the substrate. The gate structure includes a body portion and a plurality of extensions. The body portion extends along the second direction and is disposed on a portion of the first active region. The extensions is connected with the body portion and extends from the body portion to the isolation islands along the first direction. The extensions and the separate active regions are alternately disposed along the second direction. A source region is formed in the substrate in the first active region. A drain region is formed in the substrate in the second active region.

The semiconductor device according to the embodiments of the disclosure is capable of achieving a high breakdown voltage and a low on-resistance.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

An embodiment of the disclosure provides a semiconductor device. The semiconductor device is, for example, a high-voltage transistor device having a high breakdown voltage and a low on-resistance. The high-voltage transistor device has a separate active region to divide an isolation structure between a source region and a drain region into a plurality of isolation islands isolated from each other.

The technology disclosed herein can optimize the on-resistance and the breakdown voltage of the high voltage transistor device without extra masks (e.g., photoresist masks). The high voltage transistor device can be fabricated by standard processes, for example, triple well process, BCD (Bipolar-complementary metal-oxide-semiconductor (CMOS)—double-diffused metal-oxide-semiconductor (DMOS)) process, non-epitaxially-grown layer (non-EPI) process with triple well process or twin well process, and/or single poly or double poly process. The high voltage transistor device can be a low-side switch MOS transistor, a high-side switch MOS transistor, a full isolated switch MOS transistor, or a high-voltage reduced surface field (RESURF)

laterally diffused MOS (LDMOS) transistor. The high voltage transistor can be an n-channel MOS (NMOS) transistor, a p-channel MOS (PMOS) transistor, or a CMOS transistor. The technology can be applied to any suitable structure, any suitable process and/or any suitable operation voltage. Besides high voltage devices, the technology can be also used for DC (direct current) applications and/or low voltage applications.

The technology can be applied to any suitable transistor devices in any suitable substrates. For illustration purposes only, some examples in the following description are directed to an n-channel laterally-diffused (LD) MOSFET (or LDMOS transistor) as a type of high voltage transistors. The n-channel LDMOS transistor can be located in a p-type semiconductor substrate or, alternatively, a p-type epitaxial layer formed on a substrate. Some examples in the following description are directed to fabricating a single transistor by a fabrication process or forming a plurality of transistors at the same time. Moreover, in the following descriptions, "p-type" may refer to doping with a dopant of boron or $BF_2$, and "n-type" may refer to doping with a dopant of phosphorus or arsenic, for example.

Figure 1A:
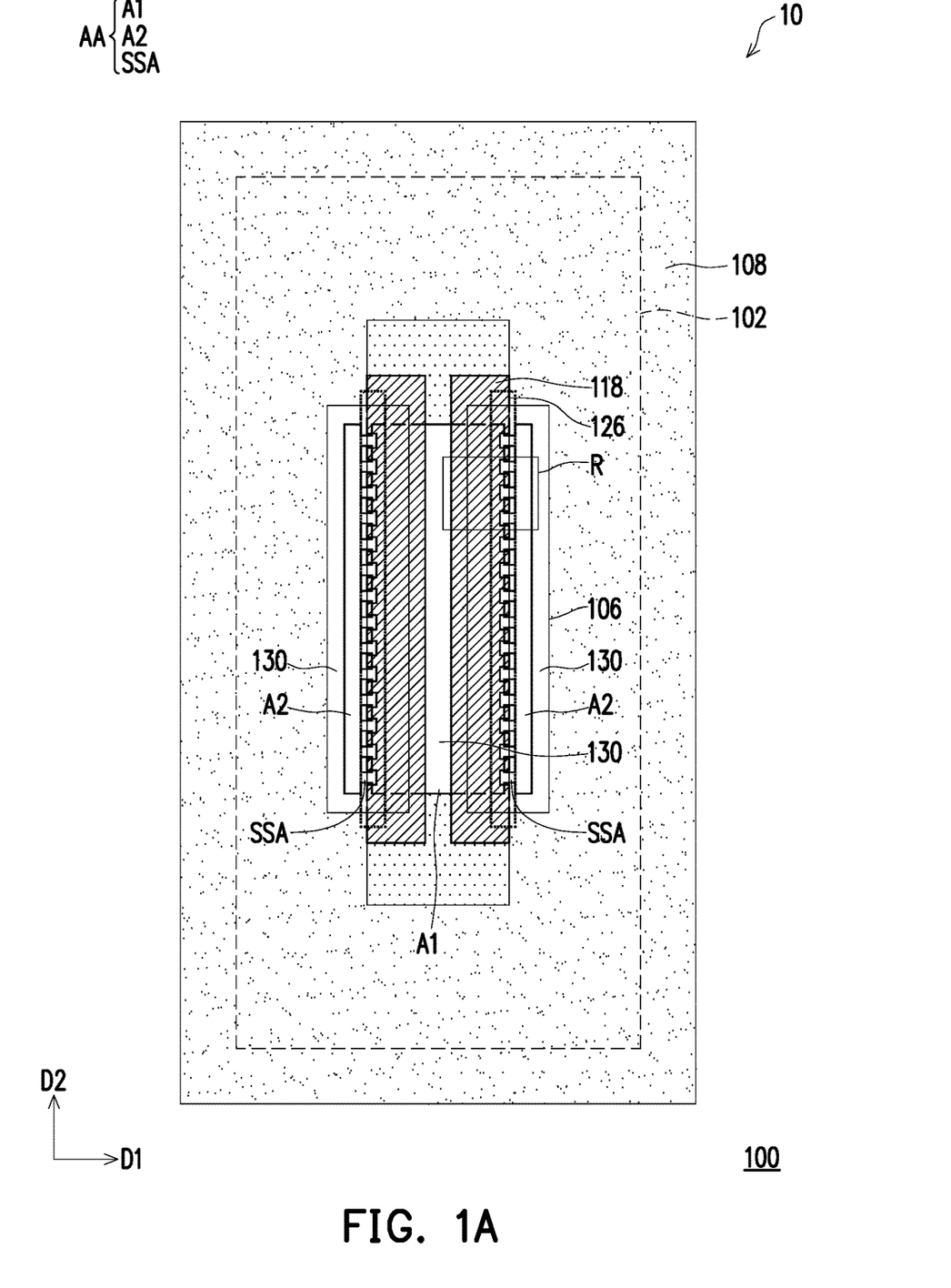
FIG. 1A is a top view illustrating a semiconductor device having a separate active region according to one or more embodiments.
Figure 1B:
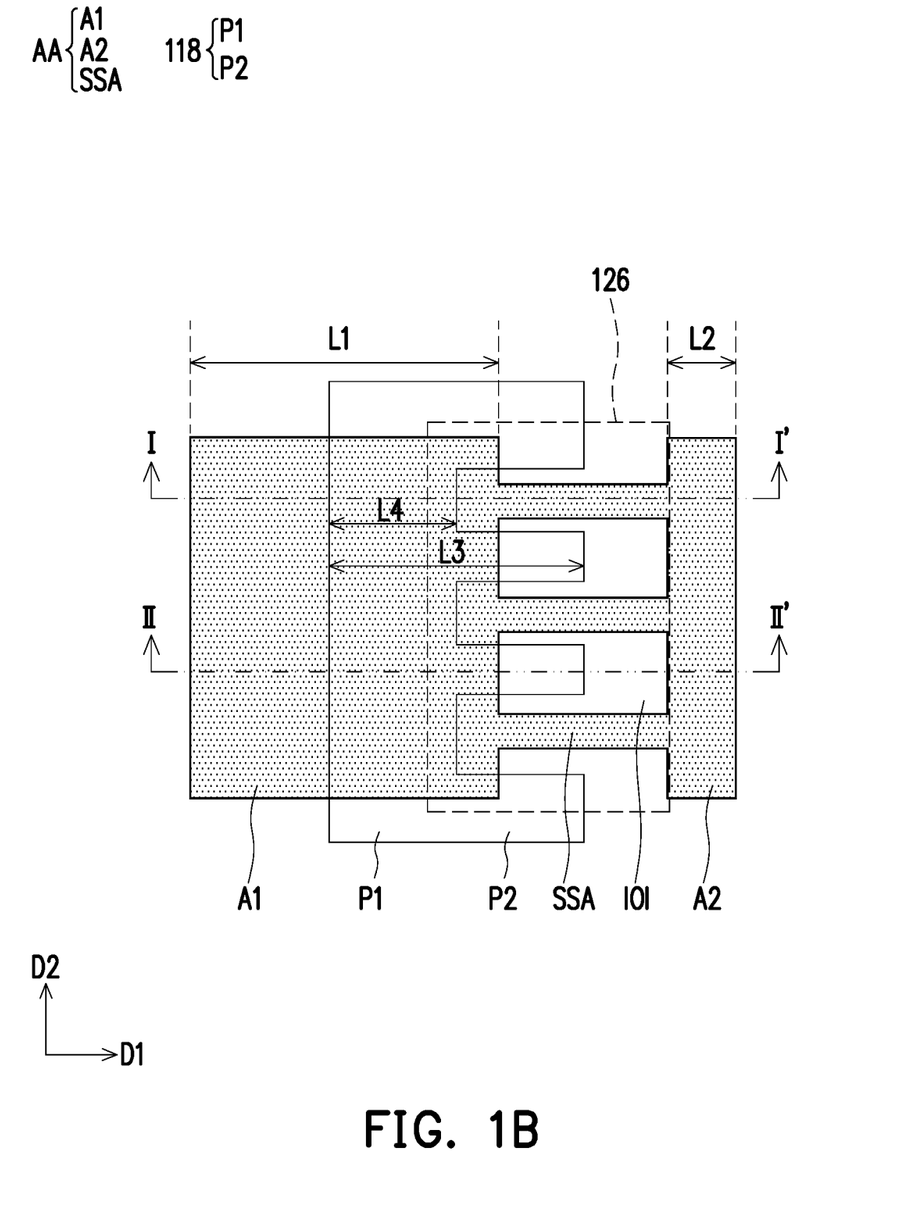
FIG. 1B is an enlarged view illustrating a region R in FIG. 1A.
Figure 2A:
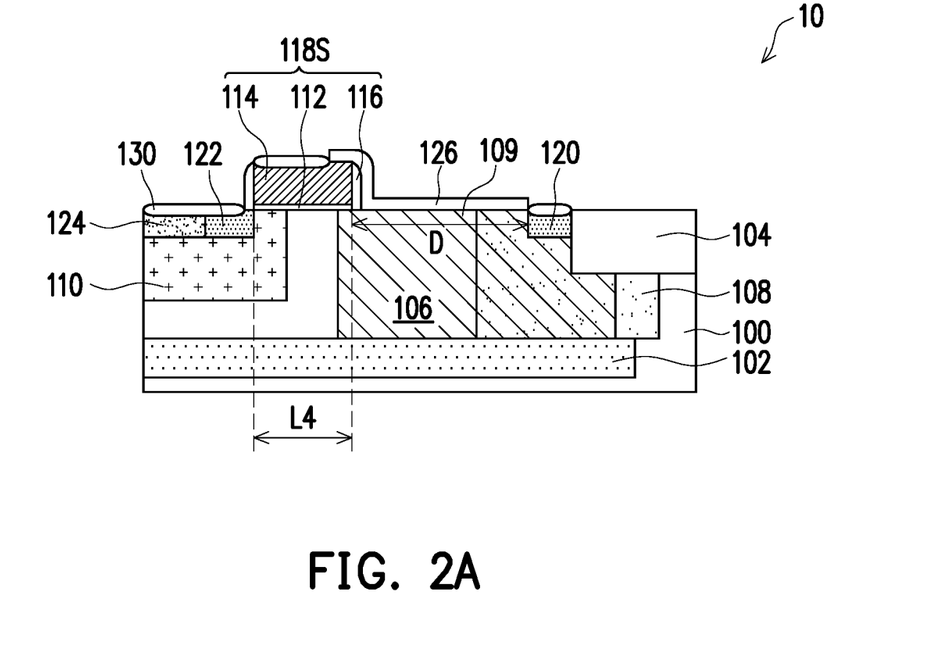
FIG. 2A is a cross-sectional view taken along a cross-sectional line I-I' of FIG. 1B.
Figure 2B:
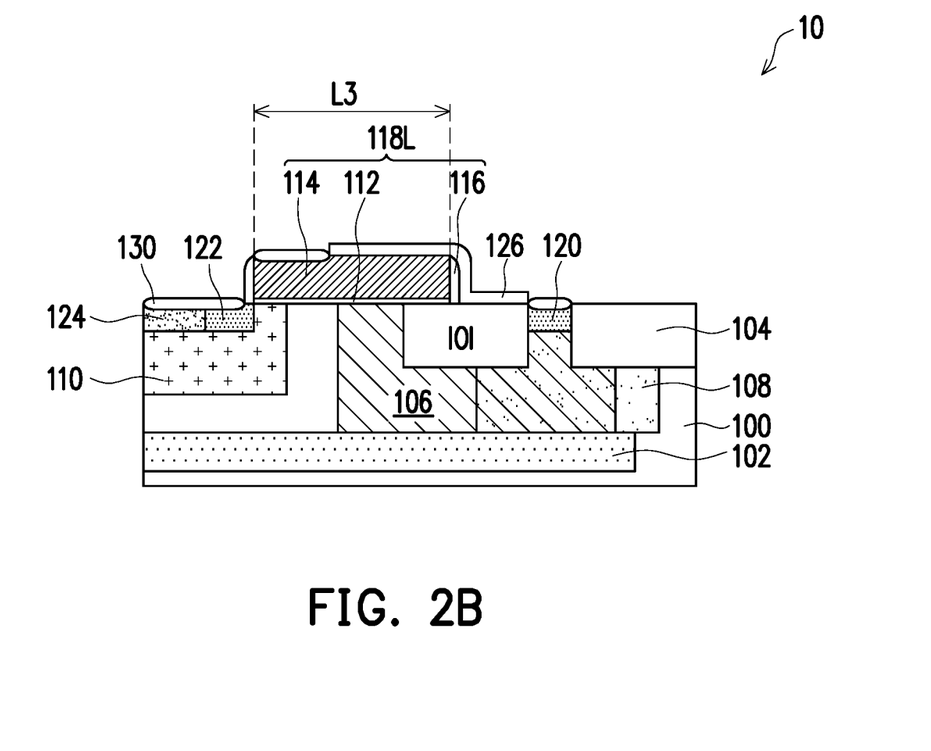
FIG. 2B is a cross-sectional view taken along a cross-sectional line II-II' of FIG. 1B.

FIG. 1A is a top view illustrating an exemplary semiconductor device having a separate active region according to one or more embodiments. FIG. 1B is an enlarged view illustrating a region R in FIG. 1A. FIG. 2A is a cross-sectional view taken along a cross-sectional line I-I' of FIG. 1B. FIG. 2B is a cross-sectional view taken along a cross-sectional line II-II' of FIG. 1B. In FIG. 1A, two high-voltage (HV) transistor devices share one source region. However, the HV transistor device of the disclosure are not limited thereto.

Referring to FIGS. 1A, 1B, 2A, and 2B, a semiconductor device 10 is an HV transistor device, for example. The HV transistor device may be an LDNMOS transistor or a drain extended NMOS transistor. The semiconductor device 10 is formed in a p-type semiconductor substrate 100. The p-type semiconductor substrate 100 may be a p-type silicon wafer or a p-type epitaxial layer formed on a substrate. The p-type semiconductor substrate 100 may have a p-type doping concentration of $10^{14}$ cm$^{-3}$ to $10^{16}$ cm$^{-3}$.

In an embodiment, the semiconductor device 10 is disposed to be completely isolated from the substrate 10, so as to receive a biased voltage independently. The semiconductor device 10 may include an n-type deep well region 102 and an n-type well region 108. The n-type deep well region 102 is also referred to as an n-type doped buried layer (NBL). The n-type well region 108 is also referred to as a first well region. The n-type deep well region 102 is disposed for vertical isolation, and the n-type well region 108 is disposed for lateral isolation. In an embodiment, the n-type deep well region 102 may have an n-type doping concentration of $10^{16}$ cm$^{-3}$ to $10^{19}$ cm$^{-3}$. The high-voltage n-type well region 108 may have an n-type doping concentration of $10^{15}$ cm$^{-3}$ to $10^{18}$ cm$^{-3}$.

An isolation structure 104 is formed in the p-type semiconductor substrate 100. The isolation structure 104 isolates the semiconductor device 10 from other transistor devices and devices formed on the p-type semiconductor substrate 100. The isolation structure 104 is, for example, a shallow trench isolation (STI) or a thick field oxide (FOX) layer. The isolation structure 104 may include one layer or a plurality of layers, and the material of the isolation structure 104 includes silicon oxide, silicon nitride, or a combination thereof. The isolation structure 104 defines an active region AA in the substrate 100. The active region AA includes a first active region A1, a second active region A2, and a plurality of separate active regions SSA located between the first active region A1 and the second active region A2. The first active region A1 and the second active region A2 extend along a second direction D2 and are disposed side-by-side along a first direction D1. The separate active regions SSA extend along the first direction D1 and connects the first active region A1 and the second active region A2, and are arranged along the second direction D2. In addition, the separate active regions SSA may further divide the isolation structure 104 into a plurality of isolation islands IOI. The separate active regions SSA and the isolation islands IOI are alternately arranged with respect to each other along the second direction D2. In some embodiments, the first active region A1, the second active region A2, the separate active regions SSA, and the isolation islands IOI are, for example, respectively rectangular from a top perspective. A length L1 of the first active region A1 in the first direction is greater than a length L2 of the second active region A2 in the first direction, for example.

In the semiconductor substrate 100, a p-well region 110 is implanted and diffused with a p-type concentration (e.g., $10^{16}$ cm$^{-3}$ to $10^{18}$ cm$^{-3}$) higher than that of the p-type semiconductor substrate 100. The p-well region 110 is also referred to as a second well region. The p-well region 110 is partially overlapped with the first active region A1. A heavily doped p+body contact region 124 (e.g., having a p-type doping concentration of $10^{19}$ cm$^{-3}$ to $10^{21}$ cm$^{-3}$) and a heavily doped n+ source region 122 (e.g., having an n-type doping concentration of $10^{19}$ cm$^{-3}$ to $10^{21}$ cm$^{-3}$) are formed in the first active region A1 of the p-well region 110. The p+ body contact region 124 may be further from a gate structure 118 (details thereof will be described in the following) than the n+ source region 122. The p-well region 110 may laterally extend beyond the p+ body contact region 124 and the n+ source region 122, and extend vertically below the p+ body contact region 124 and the n+ source region 122. The p+ body contact region 124 and the n+ source region 122 are in direct electrical contact with each other.

In the p-type substrate 100, an n-type doping drifting (NDD) region 106 (also referred to as a doped region) is implanted and diffused with a higher n-type doping concentration (e.g., $10^{16}$ cm$^{-3}$ to $10^{18}$ cm$^{-3}$). The isolation islands IOI are located in the n-type doping drifting region 106. The n-type doping drifting region 106 may laterally extend toward the gate structure 118 and is partially overlapped with the first active region A1 and laterally separated from the p-well region 110. The n-type doping drifting region 106 further extends toward the second active region A2, so that the separate active regions SSA and the second active region A2 are completely overlapped. The second active region A2 of the n-type doping drifting region 106 includes a heavily doped n+ drain region 120 (e.g., having an n-type doping concentration of $10^{19}$ cm$^{-3}$ to $10^{21}$ cm$^{-3}$). The n+ drain region 120 may be doped more heavily than the n-type doping drifting region 106.

The gate structure 118 is disposed on the substrate 100 between the n+ source region 122 and the n+ drain region 120.

The gate structure 118 includes a gate dielectric layer 112, a gate electrode 114, and a spacer 116. The gate dielectric layer 112 may include $SiO_2$ or a high dielectric constant (high-k) material (e.g., a high-k material having a k value higher than the dielectric constant (3.9) of $SiO_2$). The gate electrode 114 partially covers the p-well region 110 and the n-type doping drifting region 106. The gate electrode 114 is separated from the semiconductor substrate 100, the p-well region 110, and the n-type doping drifting region 106 by the gate dielectric layer 112. The gate electrode 114 may include doped polysilicon disposed above the gate dielectric layer 112. The spacer 116 is located on the sidewall of the gate electrode 114. The spacer 116 may include one layer or a plurality of layers, and may include silicon oxide, silicon nitride, or a combination thereof, for example.

Referring to FIG. 1B, the gate structure 118 is comb-like, for example. The gate structure 118 covers a portion of the first active region A1 and a portion of the isolation structure 104. In some embodiments, the gate structure 118 includes a body portion P1 and a plurality of extensions P2. The body portion P1 extends along the second direction D2, covers a portion of the first active region A1, and exposes the first active region A1 on two sides of the body portion P1. The extensions P2 extend along the first direction D1 and are connected with the body portion P1. Each of the extensions P2 covers a portion of the first active region A1 and a portion of the isolation island IOI. The extensions P2 and the separate active regions SSA are alternately arranged along the second direction D2.

From another perspective, the gate structure 118 includes a plurality of long portions 118L and a plurality of short portions 118S. The long portions 118L and the short portions 118S are alternately arranged along the second direction D2. The long portion 118L has a length L3 in the first direction D1, and the short portion 118S has a length L4 in the first direction D1. The length L4 is equal to the length of the body portion P1 in the first direction D1. The length L3 is equal to a total of the length of the body portion P1 in the first direction D1 and the length of the extension P2 in the first direction D1.

Referring to FIG. 2A, a side of the short portion 118S of the gate structure 118 exposes the n+ source region 122 and the p+ body contact region 124. The short portion 118S covers a portion of the P-well 110 and the substrate 100 and a first portion of the n-type doping drifting region 106. The surfaces of the p-well region 110 and the substrate 100 covered by the short portion 118S serve as a channel region. A side of the short portion 118S of the gate structure 118 exposes a second portion of the n-type doping drifting region 106 and the n+ drain region 120. There is no isolation structure in the n-type doping drifting region 106, so the semiconductor device 10 may have a low on-resistance.

In other words, an end of the gate electrode 114 of the short portion 118S is adjacent to the n+ source region 122, and another end extends over the first portion of the n-type doping drifting region 106. The second portion (from the another end of the gate electrode 114 to the n+ drain region 120) of the n-type doping drifting region 106 is adjacent to the first portion of the n-type doping drifting region 106 and has a lateral distance D. The second portion of the n-type doping drifting region 106 may be considered as a drifting region 109 for charge carriers to move from the n+ source region 122 to the n+ drain region 120. The on-resistance of the semiconductor device 10 and the doping concentration of the drifting region 109 (i.e., the concentration of the n-type doping drifting region 106) are associated with the lateral distance D. As the doping concentration of the drifting region 109 becomes higher, the on-resistance becomes lower, and as the lateral distance D becomes longer, the on-resistance becomes higher.

Referring to FIG. 2B, a side of the long portion 118L of the gate structure 118 exposes the n+ source region 122 and the p+ body contact region 124. The long portion 118L covers a portion of the p-well region 110 and the substrate 100 and a portion of the isolation island IOI. The surfaces of the p-well region 110 and the substrate 100 covered by the long portion 118L serve as a channel region. A side of the long portion 118L of the gate structure 118 exposes another portion of the isolation island IOI and the n+ drain region 120. By disposing the isolation island IOI, the semiconductor device 10 may have a high breakdown voltage.

A blocking part 126 is formed on the substrate 100, covers the separate active regions SSA and the isolation islands IOI, and exposes the first active region A1 and the second active region A2. In some embodiments, the blocking part 126 covers the n-type doping drifting region 106 and the isolation islands IOI, and exposes the p+ body contact region 124, the n+ source region 122, the gate structure 118, and the n+ drain region 120. In some other embodiments, the blocking part 126 further covers portions of the long portions 118L and the short portions 118S of portions of the gate structure 118. The blocking part 126 may include one layer or a plurality of layers. The material of the blocking part 126 includes silicon oxide, silicon nitride, or a combination thereof.

A metal silicide layer 130 is formed on the p+ body contact region 124, the n+ source region 122, the gate structure 118, and the n+drain region 120 that are not covered by the blocking part 126. The metal silicide layer 130 may include cobalt-silicide, titanium-nitride/titanium-silicide, titanium-nitride/titanium/cobalt-silicide, cobalt-polycide or titanium-nitride/titanium-polycide, titanium-nitride/titanium/cobalt-polycide.

In the embodiments of the disclosure, by modifying and designing the lengths and widths of the separate active regions SSA and the isolation islands IOI and the doping concentration of the drifting region 109, the on-resistance and the breakdown voltage of the semiconductor device 10 can be optimized. For example, by increasing the doping concentration of the drifting region 109 and reducing the length of the separate active region SSA in the first direction D1 or increasing a length ratio between the separate active region SSA and the isolation island IOI in the second direction D2, the on-resistance of the semiconductor device 10 can be reduced. By doing the opposite, i.e., decreasing the doping concentration of the drifting region 109 and increasing the length of the separate active region SSA in the first direction D1 or reducing the length ratio between the separate active region SSA and the isolation island IOI in the second direction D2, the breakdown voltage of the semiconductor device 10 can be increased.

FIGS. 3A to 3E are top views illustrating exemplary fabricating processes of a semiconductor device according to an embodiment of the disclosure. FIGS. 4A to 4E are cross-sectional views taken along a cross-sectional line III-III' in FIGS. 3A to 3E. FIG. 4F illustrates a cross-sectional view taken along a cross-sectional line IV-IV' in FIG. 3E.

Figure 3A:
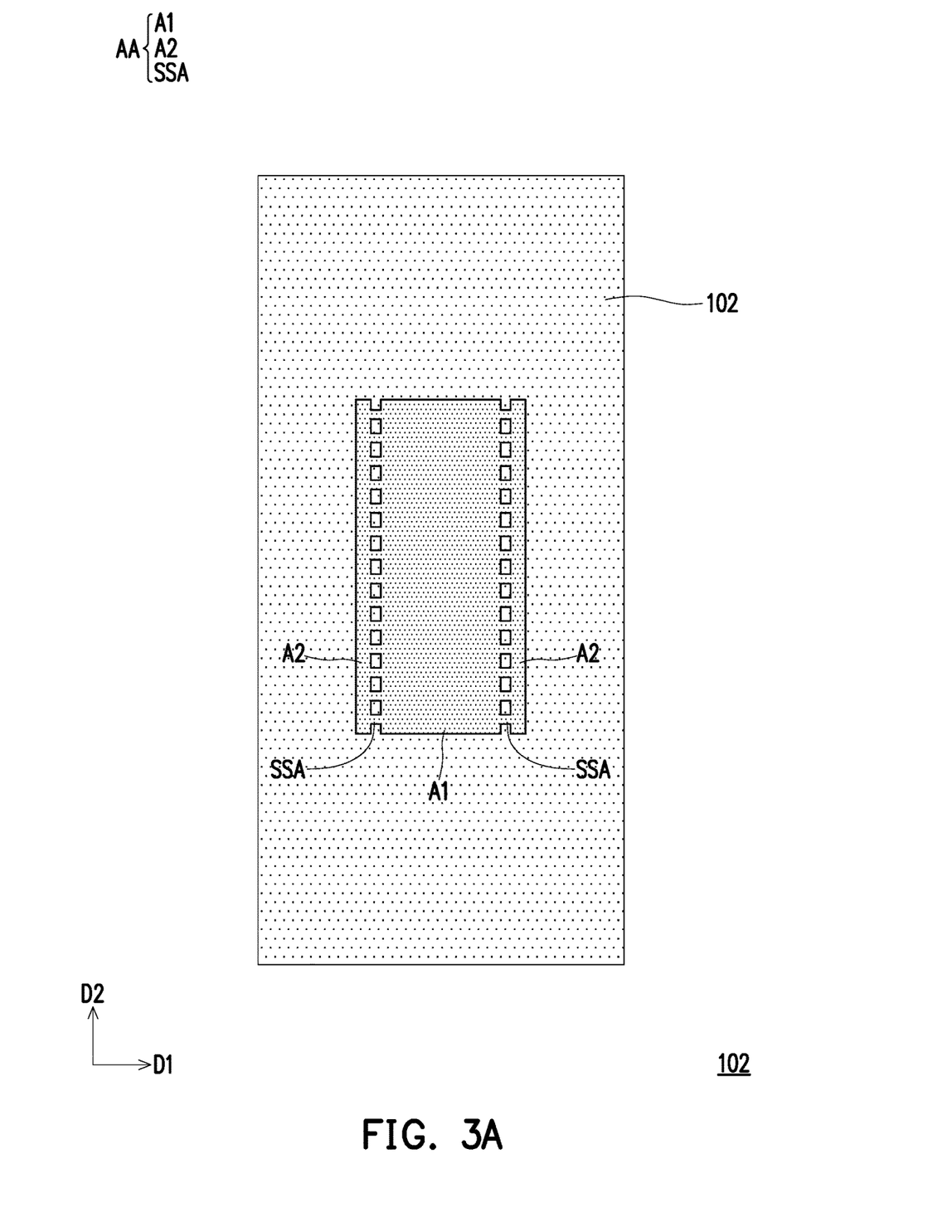
FIGS. 3A to 3E are top views illustrating exemplary fabricating processes of a semiconductor device according to an embodiment of the disclosure.
Figure 4A:
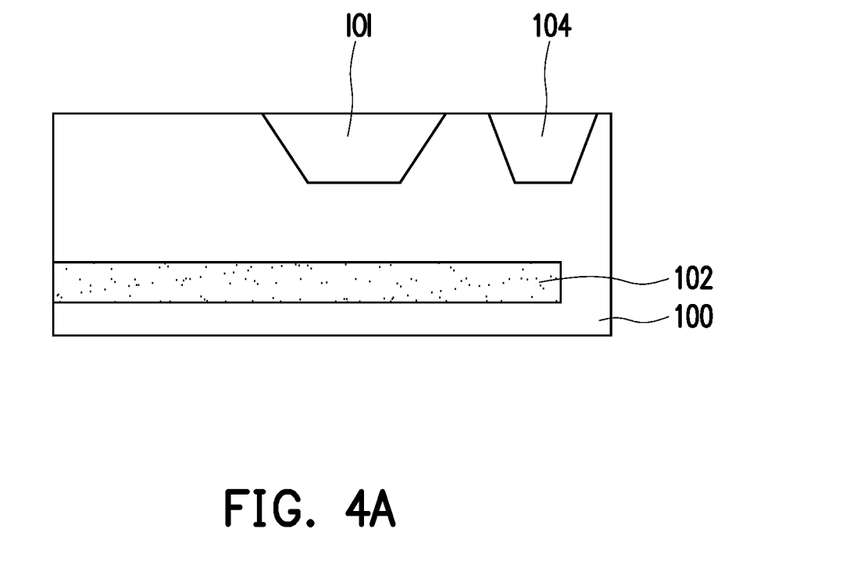
FIGS. 4A to 4E are cross-sectional views taken along a cross-sectional line III-III' in FIGS. 3A to 3E.

Referring to FIGS. 3A and 4A, the n-type deep well region 102 is formed in the substrate 100. The substrate 100 is, for example, a p-type semiconductor substrate, such as a p-type silicon substrate. A process of forming the n-type deep well region 102 includes, for example, forming an ion implantation mask on the substrate 100 and then performing an ion implantation process to implant an n-type dopant into the substrate 100. Then, the implantation mask is removed.

Next, the isolation structure 104 is formed in the substrate 100. The isolation structure 104 includes the isolation islands IOI. A process of forming the isolation structure 104 includes performing a shallow trench isolation (STI) process. The STI process includes the following. A plurality of trenches are formed in the substrate 100 by performing a photolithography and etching process. Then, an insulating material is formed on the substrate 100 and in the trenches. Subsequently, planarization is carried out by performing a chemical mechanical polishing process or an etch-back process, so as to remove the insulating material on the substrate 100. The insulating material includes silicon oxide, silicon nitride, or a combination thereof formed by performing a chemical vapor deposition process or a thermal oxidation process. The isolation structure 104 defines the active region AA in the substrate 100. The active region AA includes the first active region AA, two second active regions A2, and the separate active regions SSA. The first active region A1 is located between the two second active regions A2. The separate active regions SSA are respectively located between the first active region A1 and the second active region A2.

Figure 3B:
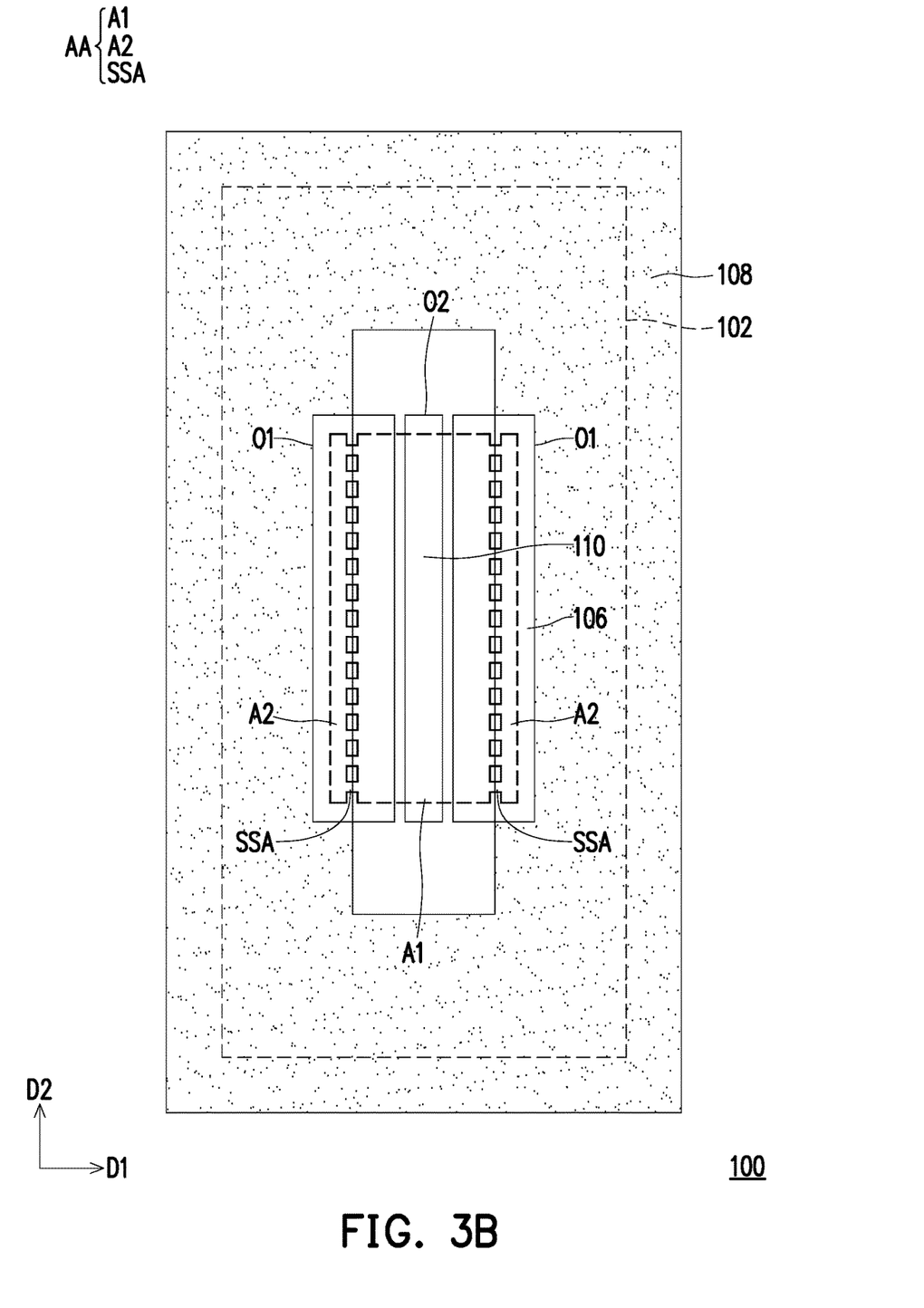
Figure 4B:
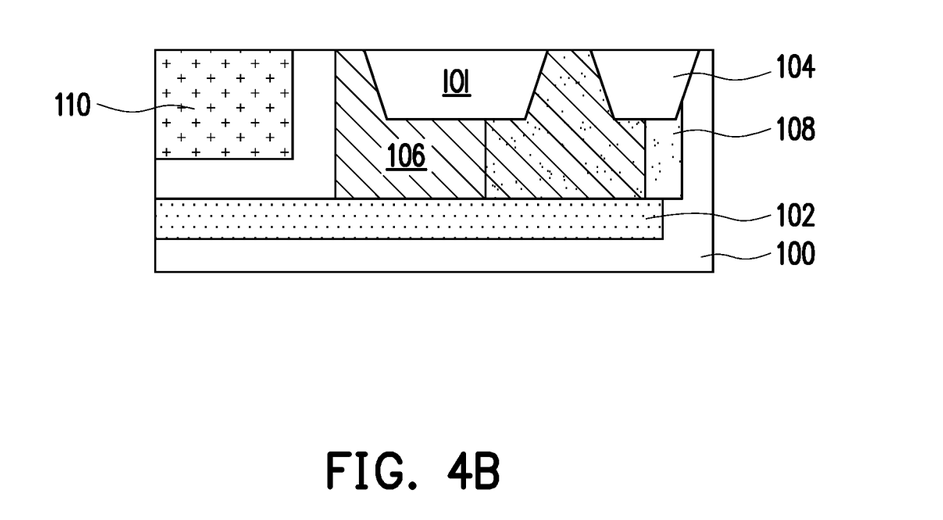

Referring to FIGS. 3B and 4B, the n-type doping drifting region 106, the n-type well region 108, and the p-well region 110 are formed in the substrate 100 above the n-type deep well region 102. The doping concentration of the n-type well region 108 may be the same as, slightly higher, or slightly lower than the doping concentration of the n-type deep well region 102. The n-type well region 108 and the p-well region 110 may be formed by forming an implantation mask on the substrate 100 and then performing an ion implantation process to respectively implant an n-type dopant and a p-type dopant into the substrate 100. Then, the implantation mask is removed. The n-type well region 108 is partially overlapped with the second active region A2, the separate active regions SSA, and the isolation structure 104. The n-type well region 108 may be annular, and the bottom surface of the n-type well region 108 is at a depth greater than the bottom surface of the isolation structure 104 and is adjacent to the n-type deep well region 102. Therefore, the n-type well region 108 and the n-type deep well region 102 may jointly define an independent region. In addition, a transistor device formed in the independent region can be completely isolated from the substrate 100 and can independently receive a biased voltage.

Referring to FIGS. 3B and 4B, the doping concentration of the n-type doping drifting region 106 may be slightly higher than the doping concentration of the n-type well region 108. The n-type doping drifting region 106 may be formed by forming an implantation mask on the substrate 100 and then performing an ion implantation process to implant an n-type dopant into the substrate 100. Then, the implantation mask is removed. The implantation mask has two openings O1. The openings O1 expose portions of the first active region A1, and expose the separate active regions SSA, the isolation islands IOI, the two second active regions A2, and portions of the isolation structure 104 adjacent to the second active region A2. Therefore, the n-type doping drifting region 106 may be partially overlapped with the first active region A1, completely overlapped with the separate active regions SSA, the isolation islands IOI, and the two active regions A2, and partially overlapped with the n-type well region 108 and the isolation structure 104. The n-type doping drifting region 106 extends vertically downward from the surface of the substrate 100 to the extent that the bottom surface thereof is adjacent to the top surface of the n-type deep well region 102 (as shown in FIG. 3B) or between the top surface of the n-type deep well region 102 and the bottom surface of the isolation island IOI (not shown). In other words, the n-type doping drifting region 106 surrounds and encapsulates the isolation islands IOI.

The doping concentration of the p-well region 110 is slightly higher than the doping concentration of the substrate 100. The p-well region 110 may be formed by forming an implantation mask on the substrate 100 and then performing an ion implantation process to implant a p-type dopant into the substrate 100. Then, the implantation mask is removed. The implantation mask has an opening O2. The opening O2 exposes the central region of a portion of the first active region A1. The n-type doping drifting region 106 is partially overlapped with the first active region A1, and is laterally separated from p-well region 110. The p-well region 100 extends vertically downward from the surface of the substrate 100, but the bottom surface of the p-well region 110 is not adjacent to, but vertically separated from, the top surface of the n-type deep well region 102. For the simplicity of the drawings, the p-well region 110 and the opening O2 are omitted in FIGS. 3C and 3D.

Figure 3C:
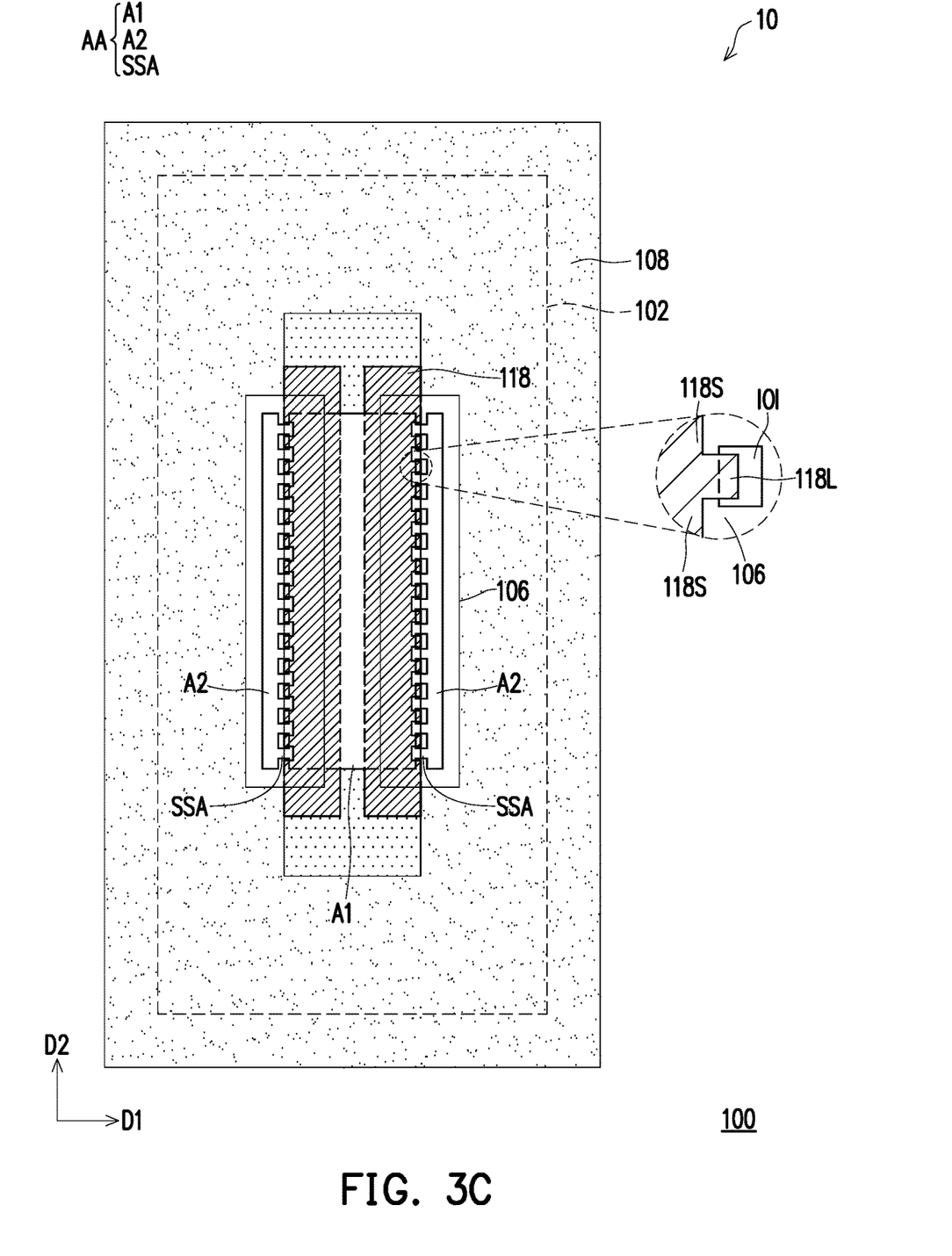
Figure 4C:
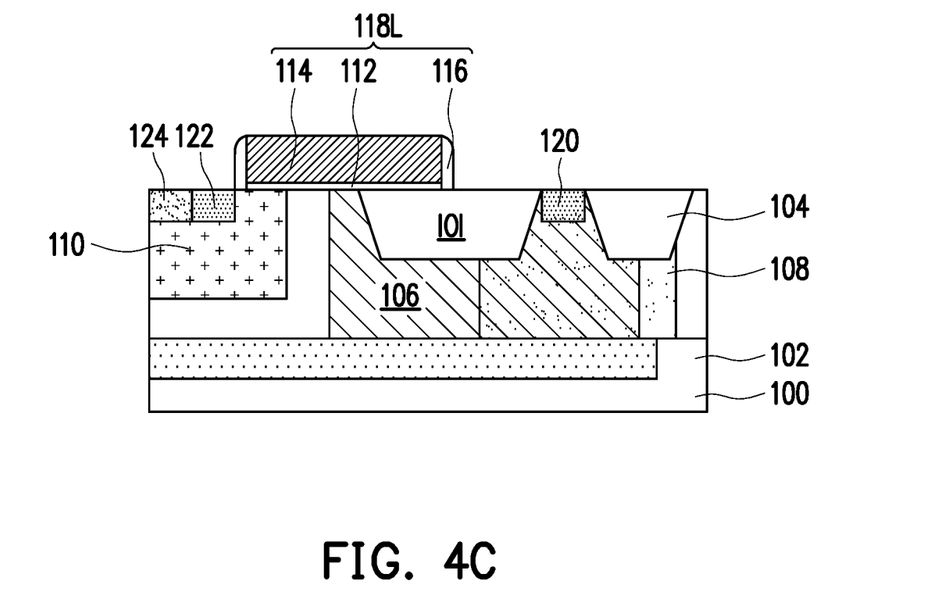

Referring to FIGS. 3C and 4C, two gate structures 118 are formed on the substrate 100. The gate structure 118 includes the gate dielectric layer 112, the gate electrode 114, and the spacer 116. A process of forming the gate structure 118 includes, for example, forming a gate dielectric material layer and a gate electrode material layer, and then patterning the gate dielectric material layer and the gate electrode material layer by performing a photolithography and etching process. Then, a spacer material layer is formed, and then an anisotropic etching process is performed on the spacer material layer. The gate structure 118 is, for example, comb-like (as shown in FIG. 3C). The gate structure 118 includes the long portions 118L and the short portions 118S alternately arranged along the second direction D2. The long portions 118L and the sort portions 118S of the gate structure 118 cover a portion of the p-well region 110, a portion of the n-type doping drifting region 106, and portions of the isolation islands IOI. A portion of the isolation island IOI is covered by the long portion 118L, and another portion of the isolation island IOI is exposed by the long portion 118L of the gate structure 118. The isolation island IOI is not covered by the short portion 118S of the gate structure 118.

Referring to FIGS. 3C and 4C, the p+ body contact region 124 and the n+ source region 122 are formed in the first active region A1, and the n+ drain regions 120 in the two second active regions A2. The doping concentration of the p+ body contact region 124 is higher than the doping concentration of the p-well region 110. The doping concentrations of the n+ source region 122 and the n+ drain region 120 are higher than the doping concentration of the n-type doping drifting region 106. Each of the p+ body contact region 124, the n+ source region 122, and the n+ drain region 120 may be formed by forming an implantation mask on the substrate 110 and then performing an ion implantation process to implant p-type dopant or n-type dopant into the substrate 100. Then, the implantation mask is removed. The n+ source region 122 and the n+ drain region 120 may be formed at the same time.

Figure 3D:
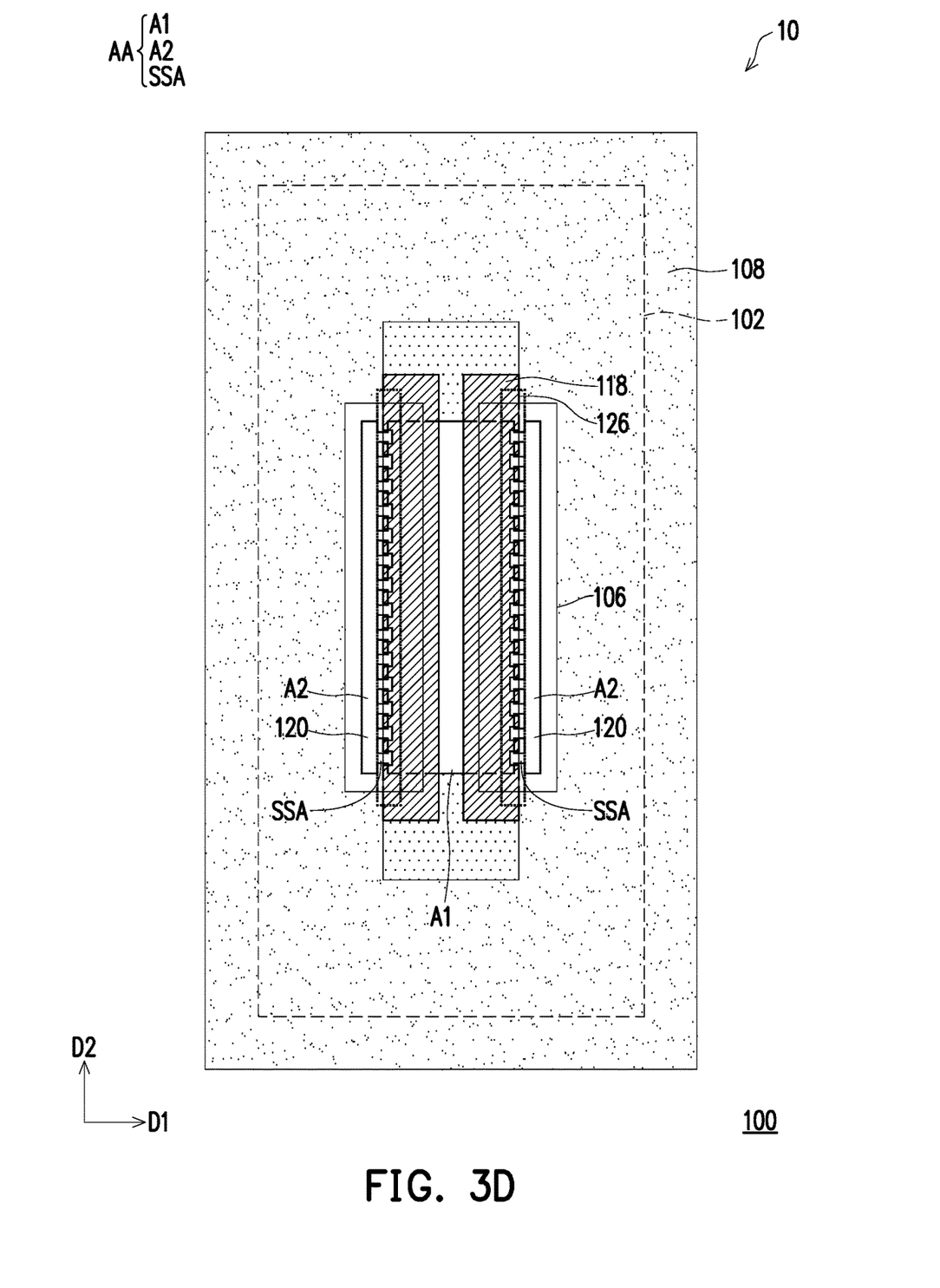
Figure 4D:
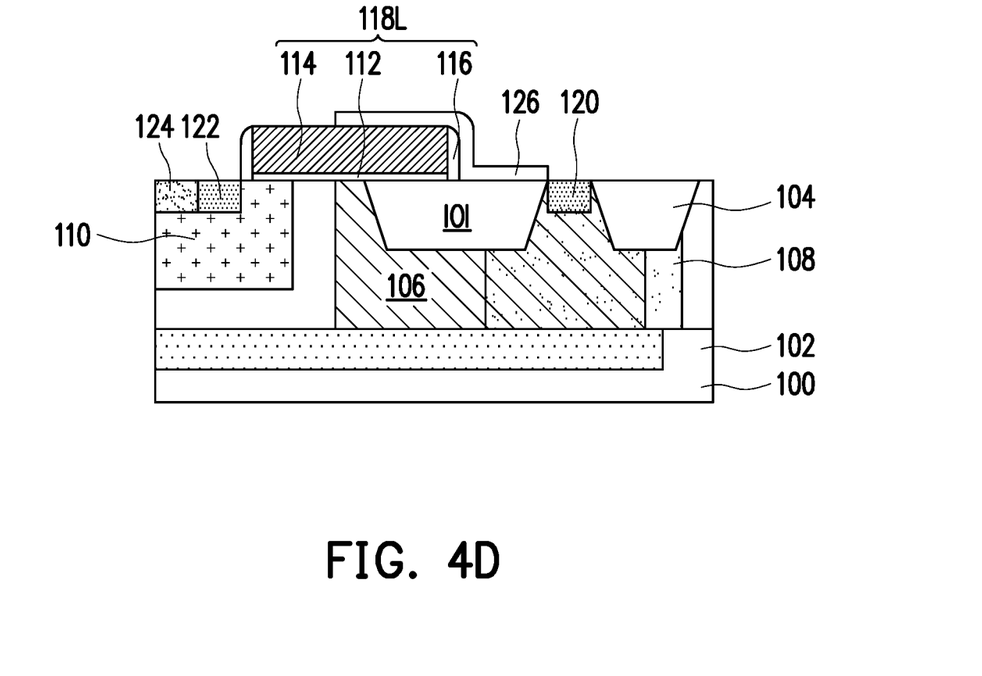

Referring to FIGS. 3D and 4D, the blocking layer 126 is formed on the substrate 100 to cover a portion of the gate structure 118, the n-type doping drifting region 106 in the separate active regions SSA, and the isolation islands IOI and expose another portion of the gate structure 118, the p+ body contact region 124 and the n+ source region 122 in the first active region A1, and the n+ drain region 120 in the second active region A2. In some embodiments, the blocking part 126 does not cover the gate electrode 114 (not shown) of the gate structure 118.

Figure 3E:
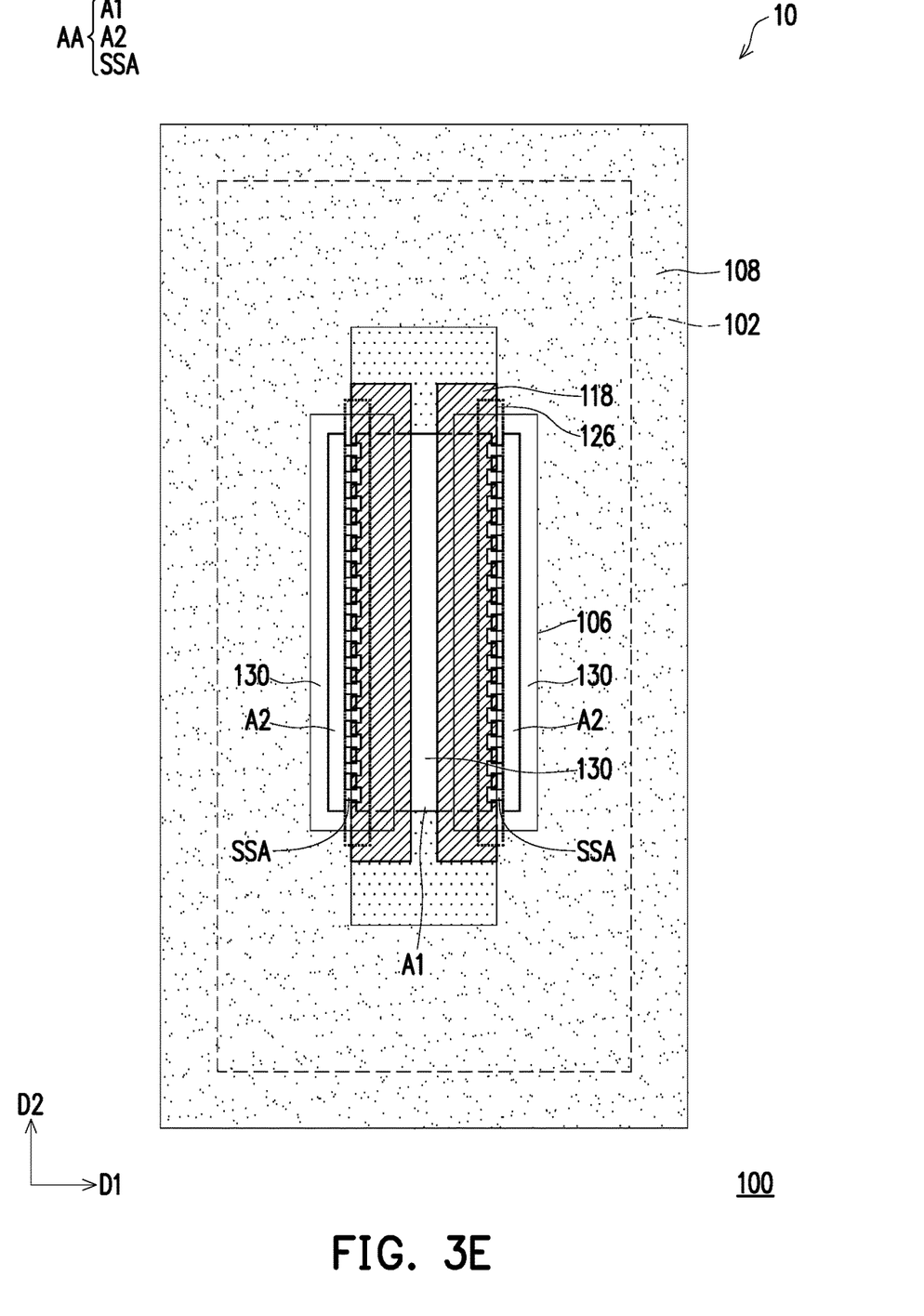
Figure 4E:
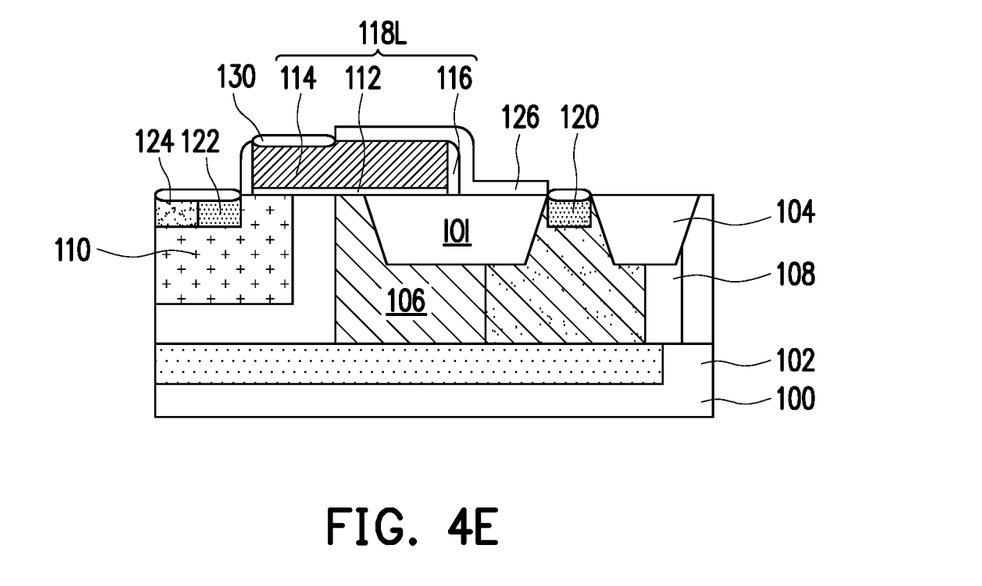
Figure 4F:
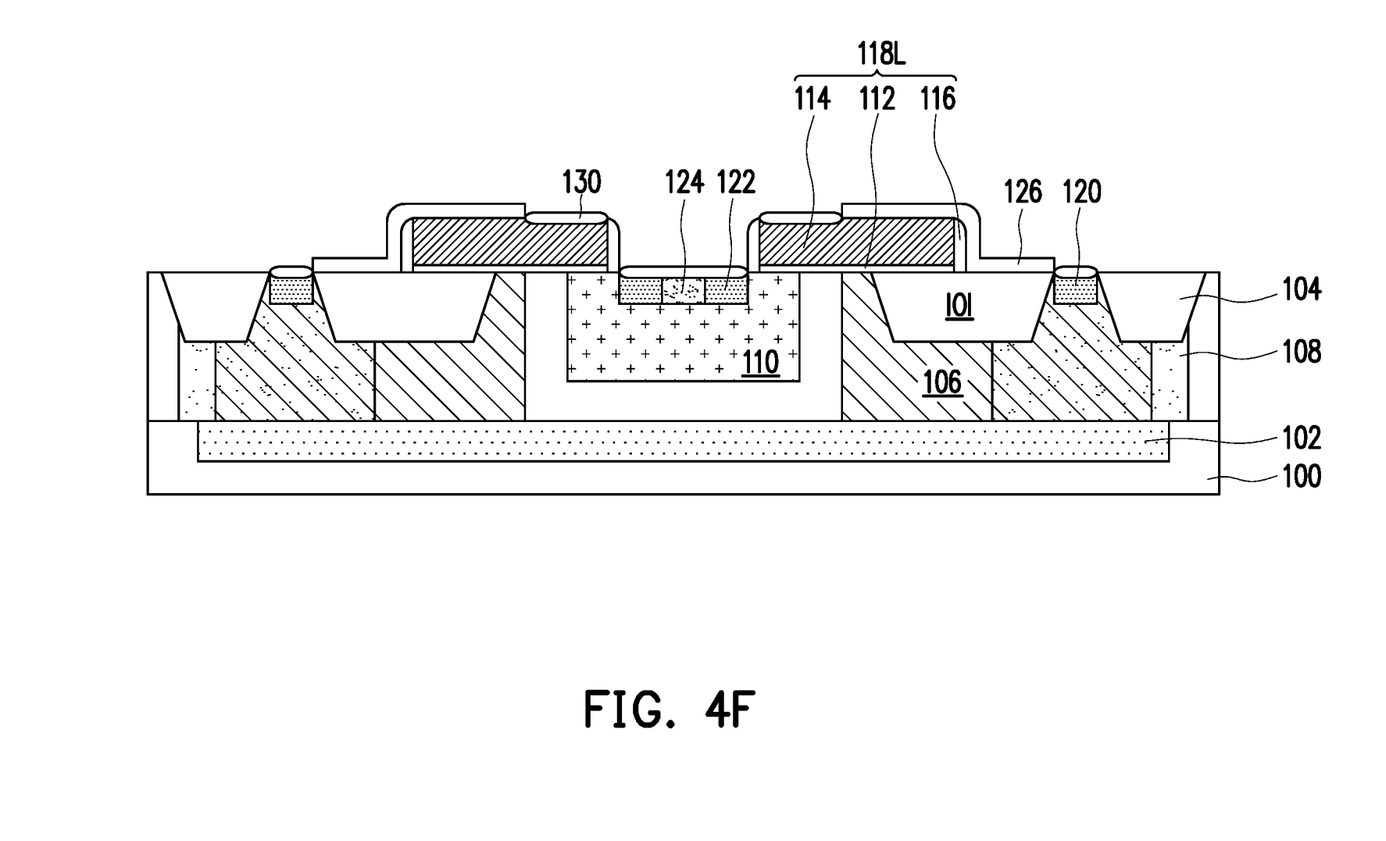
FIG. 4F illustrates a cross-sectional view taken along a cross-sectional line IV-IV' in FIG. 3E.

Referring to FIGS. 3E, 4E, and 4F, a self-aligned silicidation process is performed to form the metal silicide layer 130 on the gate electrode 114, the p+ body contact region 124, the n+ source region 122, and the n+ drain region 120.

Figure 5:
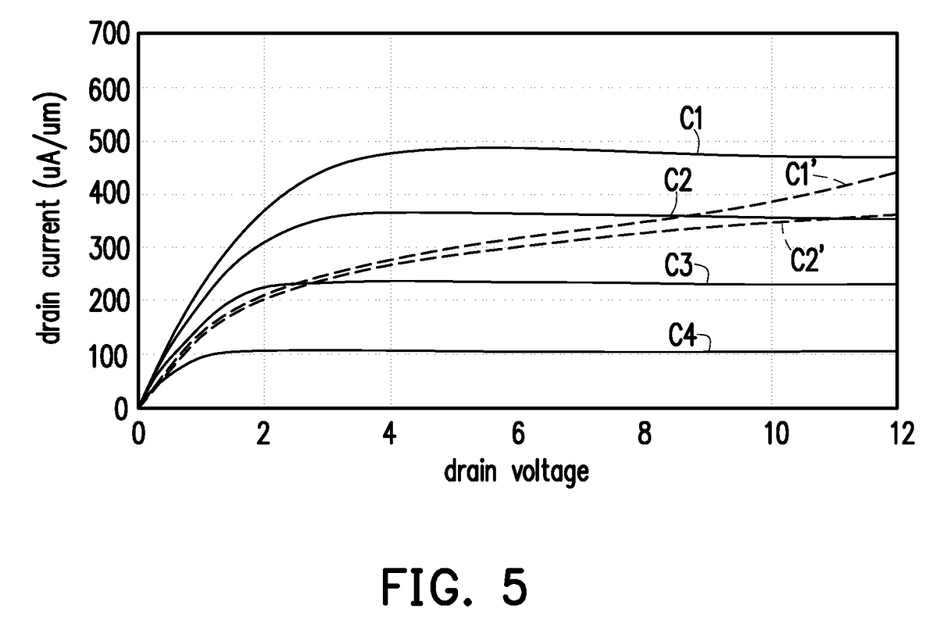
FIG. 5 is a diagram illustrating electrical property curves of drains of semiconductor devices according to the disclosure and the conventional art.

FIG. 5 is a diagram illustrating electrical property curves of drains of semiconductor devices according to the disclosure and the conventional art.

Referring to FIG. 5, the semiconductor device according to the disclosure exhibits smooth drain saturation current curves C1, C2, C3, and C4. Comparatively, saturation current curves C1' and C2' of the semiconductor device according to the conventional art are quite steep. As shown in the FIG. 5, compared with the conventional art, the semiconductor device of the disclosure exhibits smoother saturation current curves.

In the embodiments of the disclosure, by forming the separate active regions SSA connecting the first active region and the second active region, the current at the short portion of the gate electrode may flow through the drifting region having a low resistance in the separate active regions SSA via a shorter path. Accordingly, the on-resistance of the transistor device can be reduced. Experimental results indicate that the on-resistance of the conventional semiconductor device was 14Ω·mm², and the on-resistance of the semiconductor device of the disclosure was lowered to 9.4Ω·mm².

Besides, by disposing the isolation islands IOI between the first active region and the second active region, the transistor device can be maintained at the predetermined breakdown voltage.

Moreover, the long portions of the gate electrode extend to the isolation islands IOI and are capable of serving as partial field plates to keep the electric field uniform.

Therefore, the embodiments of the disclosure do not require extra masks and processes. By modifying and designing the lengths and widths of the separate active regions SSA and the isolation islands IOI, the length of the gate electrode, and the doping concentration of the drifting region, the on-resistance and the breakdown voltage of the transistor device are optimized.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, comprising:
   a substrate, comprising:
   a first active region;
   a second active region; and
   a plurality of separate active regions, extending along a first direction, arranged along a second direction, located between the first active region and the second active region, and respectively connected with the first active region and the second active region;
   a plurality of isolation islands, located in the substrate, wherein the isolation islands and the separate active regions are alternately disposed along the second direction;
   a gate structure, located on the substrate and comprising:
   a body portion, extending along the second direction and disposed on a portion of the first active region;
   a plurality of extensions, connected with the body portion and extending from the body portion to the isolation islands along the first direction, wherein the extensions and the separate active regions are alternately disposed along the second direction;
   a source region, located in the substrate in the first active region; and
   a drain region, located in the substrate in the second active region.

2. The semiconductor device as claimed in claim 1, wherein the gate structure is comb-like.

3. The semiconductor device as claimed in claim 1, wherein the gate structure comprises a plurality of long portions and a plurality of short portions that are alternately arranged, the long portions and the separate active regions are alternately arranged, the long portions cover portions of the isolation islands, and the short portions do not cover any portion of the isolation islands.

4. The semiconductor device as claimed in claim 1, further comprising:
   a doped region, located in the substrate, wherein the isolation islands and the drain region are located in the doped region, and the gate structure covers a portion of the doped region.

5. The semiconductor device as claimed in claim 4, further comprising:
   a first well region, located in the substrate, wherein the first well region and the doped region are partially overlapped, and the drain region and portions of the isolation islands are located in the first well region;
   a second well region, located in the substrate, wherein the second well region and the first well region are of different conductivity types, the source region is located in the second well region, and the body portion of the gate structure covers a portion of the second well region; and
   a doped buried layer, located in the substrate, extending from below the first well region to below the second well region, and electrically connected with the first well region.

6. The semiconductor device as claimed in claim 1, further comprising:
   a blocking layer, covering the separate active regions between the body portion of the gate structure and the drain region, and covering the substrate in a portion of the first active region; and
   a metal silicide layer, located on the source region, the drain region, and the gate structure.

7. A semiconductor device, comprising:
   a substrate, comprising an active region;
   a plurality of isolation structures located in the substrate and separated each other form by the active region;
   a gate structure, located on the substrate in the active region and extending to cover portions of the plurality of isolation structures;
   a source region located in the substrate in the active region aside the gate structure; and
   a drain region located in the substrate in the active region aside the plurality of isolation structures,
   wherein the gate structure comprises a plurality of long portions and a plurality of short portions that are alternately arranged, the long portions cover the portions of the plurality of isolation structures, and the short portions do not cover any portion of the isolation islands.

8. The semiconductor device as claimed in claim 7, wherein the gate structure is comb-like.

9. The semiconductor device as claimed in claim 7, further comprising:
   a doped region, located in the substrate, wherein the plurality of isolation structures and the drain region are located in the doped region, and the gate structure covers a portion of the doped region;

a first well region, located in the substrate, wherein the first well region and the doped region are partially overlapped, and the drain region and portions of plurality of isolation structures are located in the first well region;

a second well region, located in the substrate, wherein the second well region and the first well region are of different conductivity types, the source region is located in the second well region, and the gate structure covers a portion of the second well region; and a doped buried layer, located in the substrate, extending from below the first well region to below the second well region, and electrically connected with the first well region.

\* \* \* \* \*